United States Patent
Lai et al.

(10) Patent No.: US 8,139,393 B2
(45) Date of Patent: *Mar. 20, 2012

(54) METHOD AND APPARATUS FOR NON-VOLATILE MULTI-BIT MEMORY

(75) Inventors: Erh-Kun Lai, Elmsford, NY (US); ChiaHua Ho, Kaohsiung (TW); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 265 days.

This patent is subject to a terminal disclaimer.

(21) Appl. No.: 12/576,212

(22) Filed: Oct. 8, 2009

(65) Prior Publication Data
US 2010/0039846 A1 Feb. 18, 2010

Related U.S. Application Data

(63) Continuation of application No. 11/552,032, filed on Oct. 23, 2006, now Pat. No. 7,616,472.

(51) Int. Cl.
*G11C 11/00* (2006.01)
(52) U.S. Cl. ............. 365/148; 257/2; 257/5; 365/163
(58) Field of Classification Search .............. 257/2, 5; 365/148, 163
See application file for complete search history.

(56) References Cited

U.S. PATENT DOCUMENTS

| 5,687,112 | A | 11/1997 | Ovshinsky |
| 5,789,277 | A | 8/1998 | Zahorik et al. |
| 6,150,253 | A | 11/2000 | Doan et al. |
| 6,897,467 | B2 | 5/2005 | Doan et al. |
| 7,135,727 | B2 * | 11/2006 | Lee et al. ............ 257/296 |
| 7,161,167 | B2 | 1/2007 | Johnson |
| 7,254,059 | B2 | 8/2007 | Li et al. |
| 7,485,891 | B2 | 2/2009 | Hamann et al. |
| 7,560,337 | B2 | 7/2009 | Ho et al. |
| 7,616,472 | B2 * | 11/2009 | Lai et al. ............ 365/148 |
| 2005/0127347 | A1 | 6/2005 | Choi et al. |
| 2007/0045606 | A1 | 3/2007 | Magistretti et al. |
| 2007/0108431 | A1 | 5/2007 | Chen et al. |
| 2008/0135824 | A1 | 6/2008 | Lai et al. |

* cited by examiner

*Primary Examiner* — Alexander Sofocleous
(74) *Attorney, Agent, or Firm* — Haynes Beffel & Wolfeld LLP (57) ABSTRACT

A memory device that selectably exhibits first and second logic levels. A first conductive material has a first surface with a first memory layer formed thereon, and a second conductive material has a second surface with a second memory layer formed thereon. A connective conductive layer joins the first and second memory layers and places the same in electrical contact. The structure is designed so that the first memory layer has a cross-sectional area less than that of the second memory layer.

14 Claims, 9 Drawing Sheets

METHOD AND APPARATUS FOR NON-VOLATILE MULTI-BIT MEMORY

REFERENCE TO RELATED APPLICATION

This application is a continuation of U.S. patent application Ser. No. 11/552,032, filed on 23 Oct. 2006, which is incorporated by reference herein.

BACKGROUND OF THE INVENTION

1. Field of the Invention

The present invention relates to non-volatile memory devices, and more particularly to device suitable for constructing large-scale, ultra-compact memory systems.

2. Description of Related Art

The ever-increasing demand for stable, compact and reliable non-volatile memory, particularly for applications related to flash memory devices, has led to the introduction of a number of different devices. One highly useful technology has been resistive random access memory (RRAM), in which the memory element exhibits an ability to change between two or more states, each having a characteristic resistance level. The ability to move between such states is easily translated into an ability to display two resistance levels, which can easily be equated to logical values 0 and 1.

A number of materials have shown an ability that allows their use in such memory applications. One example are the so-called chalcogenides, which have at least two solid phases, including for example a generally amorphous solid phase and a generally crystalline solid phase. These materials can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meets tight specifications needed for large-scale memory devices. Moreover, as increases in capacity have led to decreases in the sizes required for such devices, the industry is approaching the area where physical limits, imposed, for example, by the size of the atoms involved, are impeding future developments. The art continues to seek better techniques for obtaining increased memory performance in reduced space.

SUMMARY OF THE INVENTION

An aspect of the claimed invention is a memory device that selectably exhibits first and second logic levels. A first conductive material has a first surface with a first memory layer formed thereon, and a second conductive material has a second surface with a second memory layer formed thereon. A connective conductive layer joins the first and second memory layers and places the same in electrical contact. The structure is designed so that the first memory layer has a cross-sectional area less than that of the second memory layer.

DETAILED DESCRIPTION

A detailed description of multi-bit memory cells, arrays of such memory cells, and methods for manufacturing such memory cells, is provided with reference to FIGS. 1-6.

Figure 1:
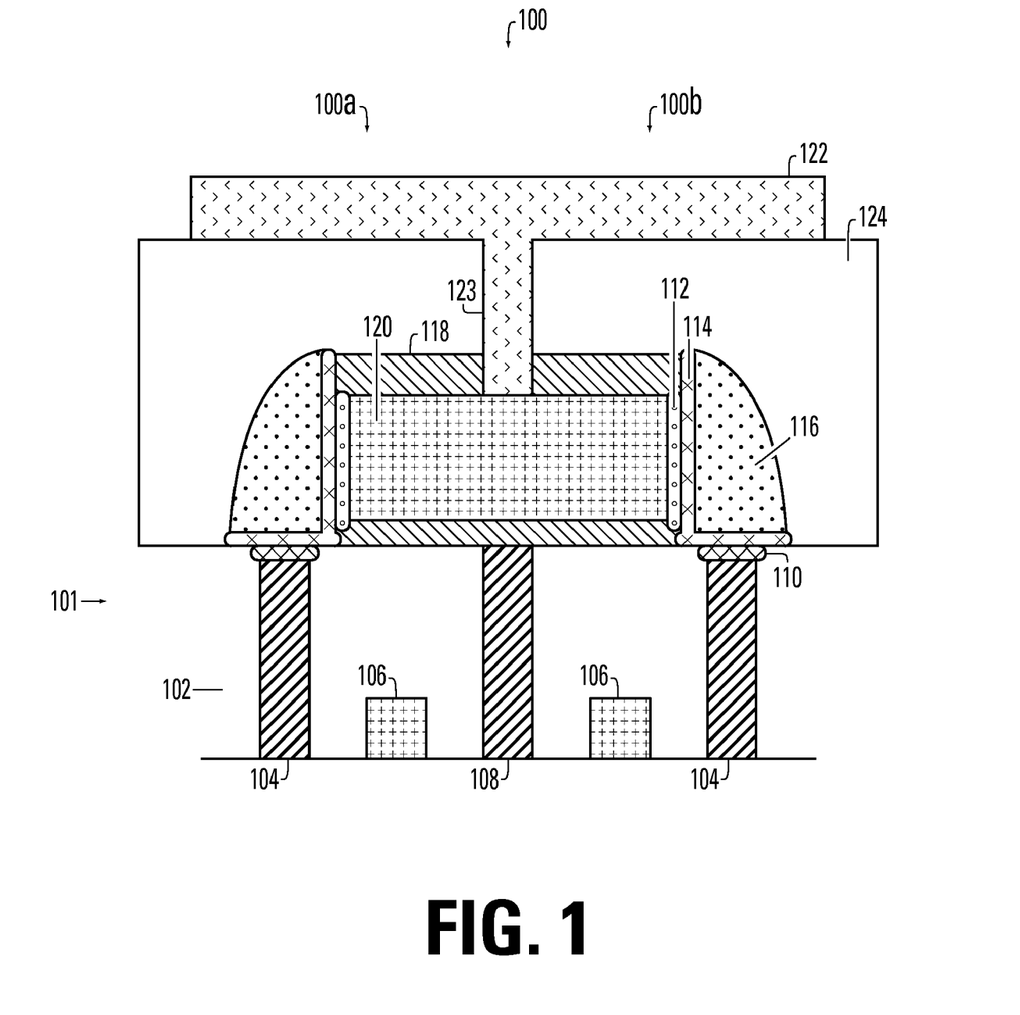
FIG. 1 illustrates an embodiment of a memory element as claimed herein.

FIG. 1 depicts an embodiment 100 of a memory cell incorporating memory elements 100a, 100b that respond to the requirements of the claims appended hereto. As is generally practiced in memory element designs, the memory element shown and discussed here is part of a larger memory circuit, in which memory elements 100a and 100b are components of memory cell 100. Memory cells are arrayed for controlled access, and a complete memory unit can hold a billion or more memory elements. The circuit arrangements apart from the memory element are outside the scope of this invention. A typical memory circuit can be seen in U.S. patent application Ser. No. 11/155,067, entitled "Thin Film Fuse Phase Change Ram and Manufacturing Method", commonly owned with the application herein, which patent application is hereby incorporated by reference herein.

The memory cell 100 is built on an underlying structure 101 that based on a conventional common source memory array structure. The constructional details are set out below, but it suffices here to note that the element is bilaterally symmetrical around a central axis corresponding to common source line 108. The halves thus defined each correspond to the structure associated with a single memory element. In common with conventional common source structures, each element structure includes a word line 106 and a plug element 104. The plug element 104 is preferably formed from a refractory metal such as tungsten. Other suitable refractory metals include Ti, Mo, Al, Ta, Cu, Pt, Ir, La, Ni, and Ru, as well as oxides and nitrides of such materials. For example, materials such as TiN, RuO or NiO are known and effective refractory metals. The word lines 106 are preferably formed from polysilicon, silicides, or similar material. These components are embedded in a conventional inter-layer dielectric/inter-metal dielectric (ILD/IMD). As is known, this dielectric should exhibit as low a dielectric constant as possible, and is preferably formed of silicon dioxide or similar material, as understood by those in the art.

The structure overlying the common source layer is centered on metal layer 120. in the embodiment shown, copper metallization can be used. Other types of metallization, including aluminum, titanium nitride, and tungsten based materials can be utilized as well. Also, non-metal conductive material such as doped polysilicon can be employed. The metal layer is positioned between layers of SiN 118, positioned respectively above and below the metal layer. As will be explained in further detail below, this three-layer assembly extends to points adjacent to but not overlapping plug elements 104. Further, the SiN material does not cover the meal layer. The metal layer is preferably between 10 and 200 nm thick, and most preferably about 20 nm thick. The two SiN layers are preferably between 20 and 100 nm thick, and most preferably about 30 nm thick.

At the top of each plug element and at each end of the metal layer are positioned memory layers 110 and 112, respectively. The composition of these layers is discussed below. These layers are generally tabular in form, with a thickness ranging from 2 nm to 300 nm, preferably about 10 nm.

Each of the memory layers 110, 112 is formed from a material that can assume at least two stable resistance levels, referred to as resistance random access memory (RRAM) material. Several materials have proved useful in fabricating RRAM, as described below.

An important class of RRAM material is the chalcogenide group. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Because chalcogenides achieve their dual-memory capabilities by forming two solid phases, each of which exhibits a characteristic resistance, these materials are referred to as "phase change" materials or alloys.

Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention. One such material is a colossal magnetoresistance (CMR) material, which dramatically change resistance levels in the presence of a magnetic field. Such materials are generally manganese-based perovskite oxides, and the resistance changes encountered are generally in the range of orders of magnitude. A preferred formulation for RRAM applications is $Pr_{x^-}$ Ca$_y$MnO$_3$, where x:y=0.5:0.5, or other compositions in which x:0~1; y:0~1. Other CMR materials including an Mn oxide can also be employed.

Another RRAM material is a 2-element compound, such as Ni$_x$O$_y$; Ti$_x$O$_y$; Al$_x$O$_y$; W$_x$O$_y$; Zn$_x$O$_y$; Zr$_x$O$_y$; Cu$_x$O$_y$, where x:y=0.5:0.5. Alternatively, another compound in this group could be employed, in which x: 0~1; y: 0~1. Also, polymers employing dopants such as Cu, C60, Ag can be employed, including 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

Overlying the memory layers is a barrier layer, which in the illustrated embodiment takes the form of an L-shaped layer. This layer must demonstrate three characteristics: First, excellent adhesion to the phase change material discussed below; second, good electrical conductivity; and finally, diffusion barrier characteristics, particularly against diffusion from metals such as the plug material or metal layer at elevated operating temperatures. These layers preferably are made up of TiN or TaN. Alternatively, the barrier layers may be TiAlN or TaAlN, or may comprise, for further examples, one or more elements selected from the group consisting of Ti, W, Mo, Al, Ta, Cu, Pt, Ir, La, Ni, and Ru and combinations thereof The barrier layers preferably extend across the width of the plug element, extending upward across the face of the metal layer, preferably completely covering the memory layers 110 and 112.

A layer of dielectric material 116 overlies the barrier layer 114. This layer may be formed from dielectric fill materials, which may be the same as the material chosen for IMD 124, discussed below. This layer serves as a spacer for the self-aligned barrier layer 114, as set out more fully in connection with FIG. 6e.

The memory cell is encased in an IMD 124, preferably comprising silicon dioxide, a polyimide, silicon nitride or other dielectric fill material. In the embodiment shown, this layer is planarized, preferably employing a chemical-mechanical polishing (CMP) process, providing a flat surface for deposition of the overlying materials.

Bit line 122 lies atop the IMD, extending into the IMD to make contact with the metal layer 120 through via 123. This layer also provides contact to the remainder of the memory circuitry, as will be understood by those in the art and not further illustrated herein. This component can be formed from any of the known materials conventionally employed in the art for such applications. In one embodiment, the bit line is formed from a Ti compound, such as TiN, or an n+ polysilicon, or a multilayer material that includes a Ti layer, such as a TiN/W/TiN sandwich material, or the similarly structured TiN/Ti/Al/Tin material.

Figure 2:
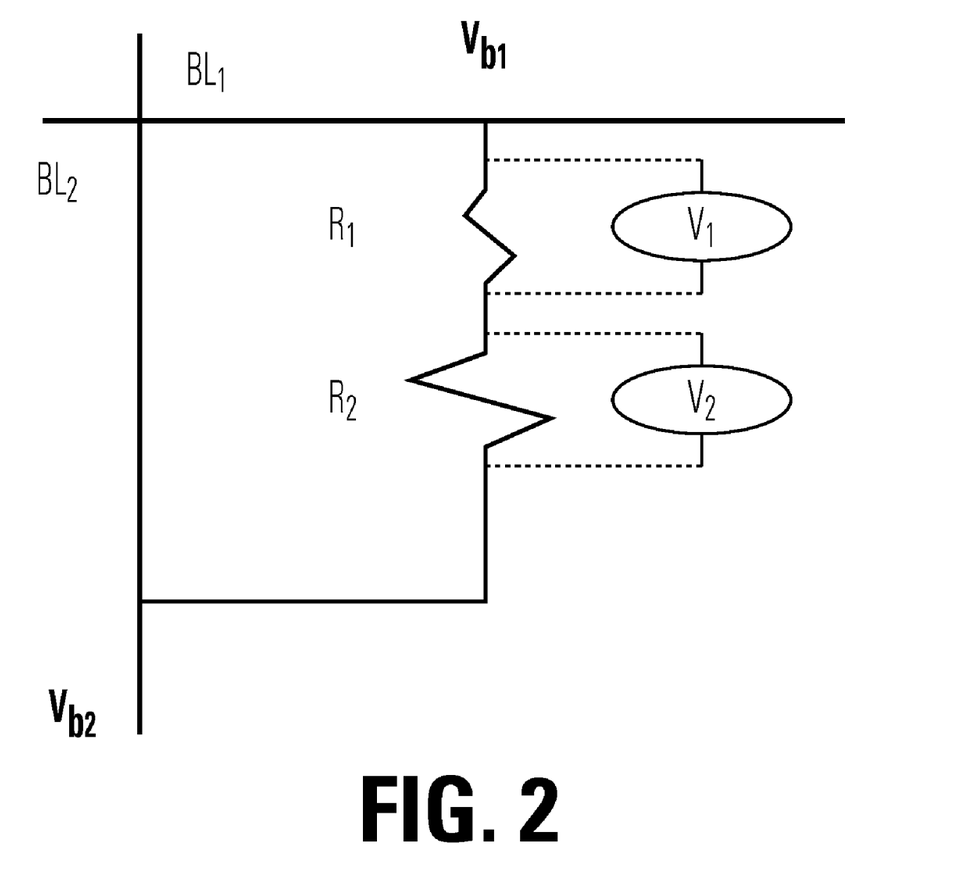
FIG. 2 is a schematic diagram of the electrical circuit of the device shown in FIG. 1.

The structure of FIG. 1 can be represented schematically by the equivalent circuit of FIG. 2. There, two resistances, R1 and R2, are arranged in series between two bit lines, BL1 and BL2. Voltage applied to the respective bit lines is indicated by Vb1 and Vb2, respectively, and the voltage drop across the two resistances is V1 and V2. the voltage drop between the two bit lines is thus Vb2−Vb1, which equals V1+V2. As indicated on the drawing, the area of RRAM element R1 is smaller than that of element R2, and therefore the resistance R1 is greater than R2,

TABLE 1

| | States/Values | |
|---|---|---|
| R1 | R2 | Cell Value |
| RESET | RESET | 0 |
| RESET | SET | 1 |
| SET | RESET | 2 |
| SET | SET | 3 |

Combinations of RRAM states, and their resulting cell values, are shown in Table 1. The cell values correspond to relative overall resistance values.

It should be noted that the embodiment shown in Table 1 follows a "small-endian" structure. That is, the last element is the least significant digit (LSD) and the first is the most significant digit (MSD). Other embodiments follow a "big-endian" model, in which the digits were reversed, and in which the processes set out below are identical, but the two memory elements are reversed.

Figure 3A:
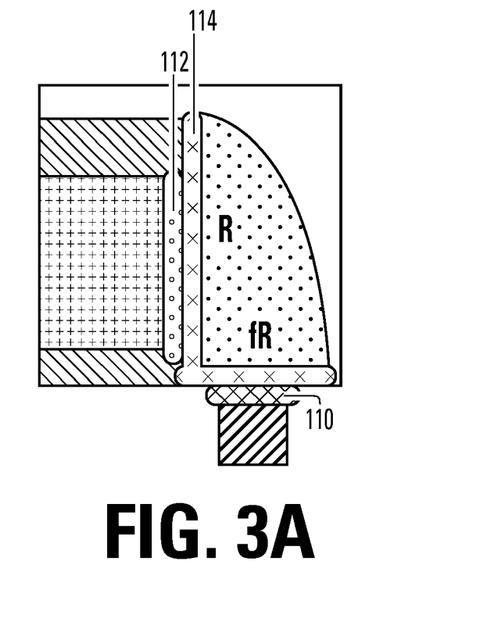
FIGS. 3a-3d schematically depict the resistance values for the logic states attainable by the device shown in FIG. 1.

Derivation of expressions that describe the relationships present at each cell state are shown in FIGS. 3a-3d. FIG. 3a depicts the cell with first memory element 112 and conductive barrier layer 114 and second memory element 110 There, both elements are in a RESET state, having low resistance. If R is taken as the resistance of the larger RRAM element 112, then the other element 110 has a resistance value related to that of element 112 by a constant f. In the embodiment shown, element 110 has a higher resistance than does element 112, and thus constant f is known to be greater than 1, but other embodiments set out the semantics in an opposite sense. The value of f determines the operation window of the device—that is, the allowable amount of resistance variation. The device is tuned, so that the value of f is sufficient to permit 2-bit operation.

As depicted, the difference in resistance that appears in the embodiment of FIGS. 3a-3d results from a difference in size of the two RRAM elements. The smaller element has the higher resistance value. In other embodiments (not shown) an operationally identical resistance differential could be obtained by employing different materials for the two elements. The structural difference between the two embodiments would not affect the expression of their relationships, however, as the difference would still be captured by the constant f. In the embodiment here, the two RRAM elements are about the same thickness (as set out in more detail below), but their width differs, and that difference produces the difference in resistance.

The two RRAM elements are arranged in series, and therefore the resistance of the cell as a whole can be expressed as R+fR, or (1+f)R.

Figure 3B:
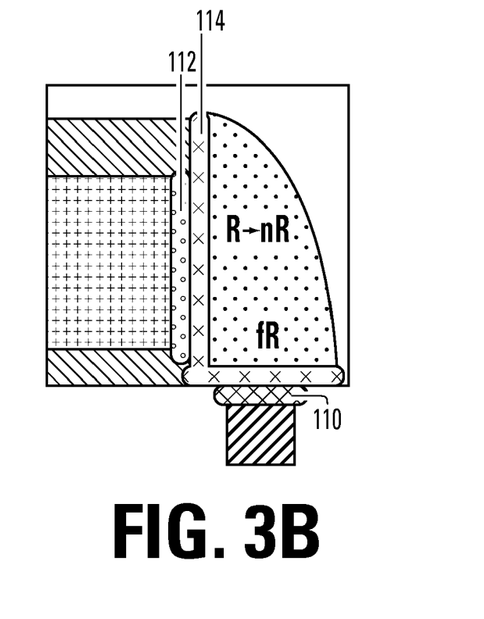

Conversion of the low-order element 112 to a SET state, having a relatively high resistance level, is shown in FIG. 3b. There, the resistance level rises by an amount proportional to a constant n. Different materials will exhibit different constants, based on the properties of the particular compound or allow chosen, but for a given material the relationship between RESET and SET states can be expressed by the relationship shown in FIG. 3b, R→nR. Thus, the state depicted in FIG. 3b can be described by the expression fR+nR, or (n+f)R.

Figure 3C:
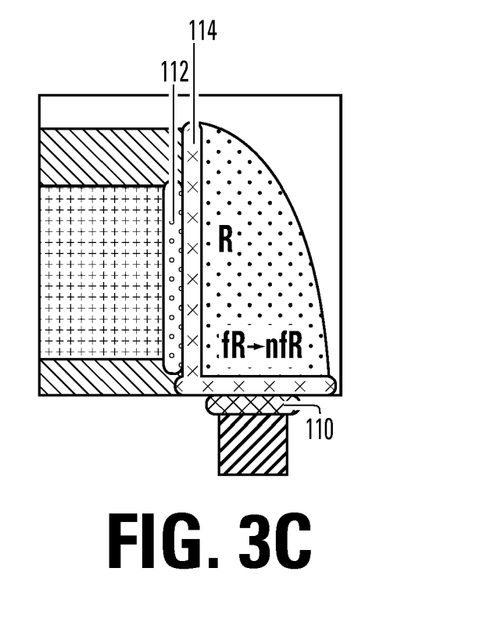

Similarly, FIG. 3c depicts the result of converting RRAM element 110 to a SET state, leaving 112 at RESET. In the embodiment shown, with the two elements formed from the same material, the constant n will describe the difference between SET and RESET values, allowing one to describe the resistance value by nfR. That leads to the overall expression (1+nf) R to describe the resistance value of the cell.

Figure 3D:
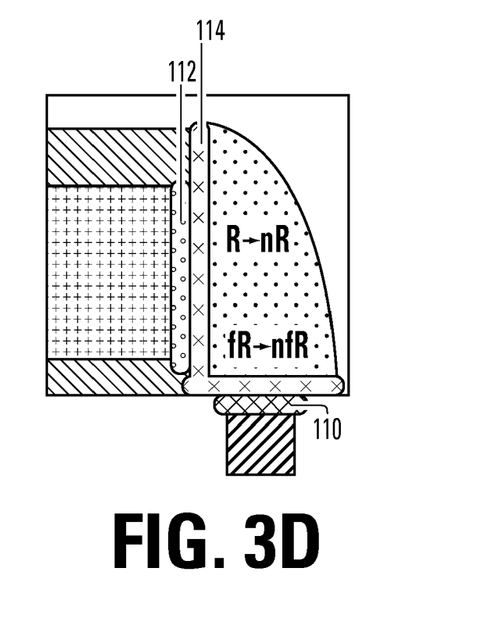

Finally, FIG. 3d illustrates the result of converting both RRAM elements 112 and 110 to a SET state, producing transitions R→nR (for M2) and fR→nfR (for element 112). The state can be expressed as nR+nfR, or n(1+f)R.

The semantic relationships associated with the four cell values are summarized in Table 2, below.

TABLE 2

Cell value Relationships

| Relationship | Cell Value |
|---|---|
| (1 + f) R | 0 |
| (n + f) R | 1 |
| (1 + nf) R | 2 |
| n (1 + f) R | 3 |

It should be noted that the values of n and f are chosen at n=100 and f=2, respectively. Those values produce total resistance results in the example of Table 1 of 3R, 102R, 210R and 300R.

Setting the memory cell to a desired value is accomplished by applying voltage across the bit lines BL1 and BL2 (FIG. 2). A total of four voltages suffices to accomplish all possible values shown in Table 1. Those in the art will understand that a number of possibilities exist for the actual voltages. In one embodiment, two positive voltages (where positive is measured at Vb2 with respect to Vb1) and two negative voltages are employed, the resulting voltages being labeled VHIGH, VLOW, −VHIGH and −VLOW. The absolute values of applied voltage will depend on the characteristics of the memory elements involved, including the materials and sizes employed. In the embodiment shown, a HIGH value of 3.3 v and a LOW value of 1.5 have proven effective.

The first, and most critical, procedure is the general RESET, which drives both RRAM elements to the RESET state, producing a cell value of 0. This procedure is shown in Table 3, below.

TABLE 3

Transition RESET all.
$(V_{B2} - V_{B1}) = -V_{HIGH}$

| Element State | Cell | Action | Element State | Cell |
|---|---|---|---|---|
| M1  1 | 3 | \|V1\| > VRESET | 0 | 0 |
| M2  1 | | \|V2\| > VRESET | 0 | |

As shown, the appropriate voltage for this transition is −VHIGH, such that the absolute values of the voltage drops V1 and V2 each exceeds the RESET value. With both RRAM elements in RESET state, the overall value of the cell is then 0.

The RESET condition is the starting point for all further operations. Because unpredictable results could occur in transitions between intermediate states, it is preferred to reduce the unit to a RESET condition as the first step in any state change operation.

The opposite condition, a cell value of 3, is shown in Table 4, below.

TABLE 4

Transition 0-3
$(V_{B2} - V_{B1}) = V_{HIGH}$

| Element State | Cell | Action | Element State | Cell |
|---|---|---|---|---|
| $M_1$  0 | 0 | $V_1 > V_{SET}$ | 1 | 3 |
| $M_2$  0 | | $V_2 > V_{SET}$ | 1 | |

There, the $V_{HIGH}$ voltage is applied, sufficient to produce voltage drops exceeding $V_{SET}$ for both elements. With both elements in the SET state, the cell value is binary 11, or 3.

To produce a cell value of 2, the process shown in Table 5, below, is followed.

TABLE 5

Transition 0-2
$(V_{B2} - V_{B1}) = V_{LOW}$

| Element State | Cell | Action | Element State | Cell |
|---|---|---|---|---|
| $M_1$  0 | 0 | $V_1 > V_{SET}$ | 1 | 2 |
| $M_2$  0 | | $V_2 < V_{SET}$ | 0 | |

At this setting, the voltage drop $V_1$ is greater than that required to produce a SET condition, so $R_1$ is SET, but the voltage drop $V_2$ is less than the SET requirement, leaving that element in a RESET condition. The result places $R_1$ in a SET condition, with $R_2$ in RESET, resulting in a cell value of binary 01, or 2.

Producing a cell value of 1 is illustrated in Table 6, below. Arriving at a 1 value is more difficult than the other transitions, as it is intuitively obvious that if one starts with both elements at RESET, application of a voltage sufficient to produce a SET condition in V2 would necessarily also SET V1, resulting in a value of 3, not 1. The solution is first to bring the cell to a fully SET state, as shown in Table 3 above. Then, starting from a cell value of 3, a −VLOW voltage is applied, sufficient to produce a RESET in R1 but not R2, producing a cell value of binary 01, or 1.

TABLE 6

Transition 3-1
$(V_{B2} - V_{B1}) = -V_{LOW}$

| Element State | Cell | Action | Element State | Cell |
|---|---|---|---|---|
| $M_1$  1 | 3 | $\|V_1\| > V_{RESET}$ | 0 | 1 |
| $M_2$  1 | | $\|V_2\| < V_{RESET}$ | 1 | |

Figure 4:
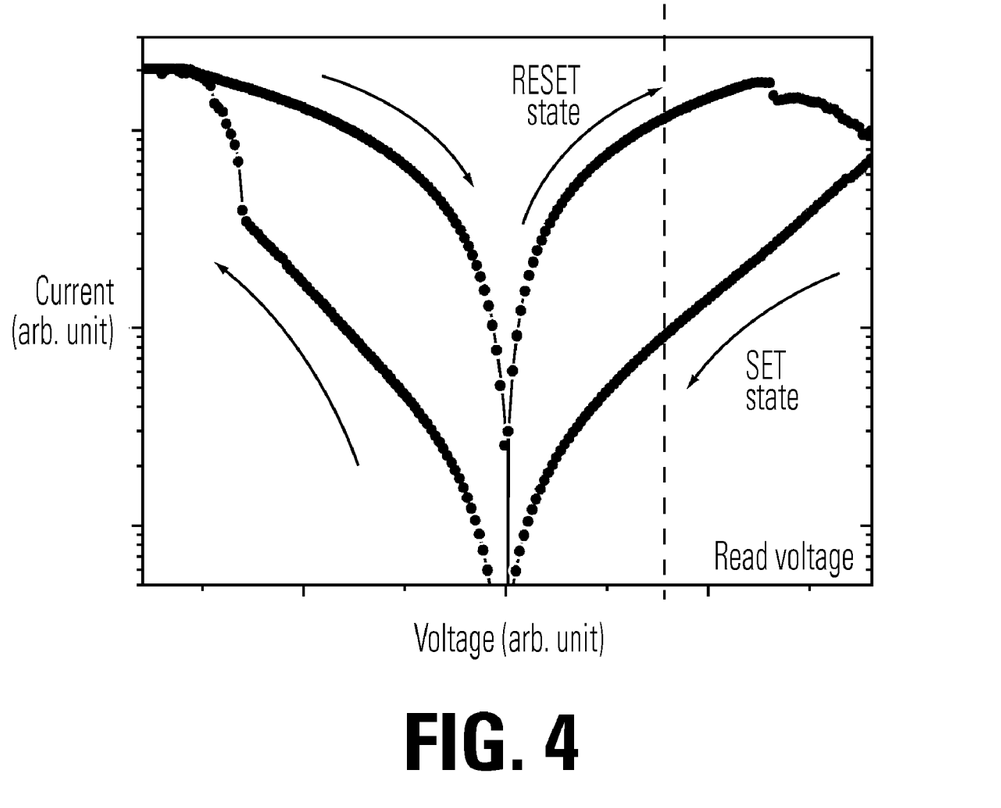
FIG. 4 is a graph of voltage vs. current in the device shown in FIG. 1.

The Voltage Current characteristics of the cell of FIG. 1 is shown in FIG. 4. As can be seen, two curves exist, one reflecting the transition from RESET to SET, and another for the opposite sense.

Figure 5:
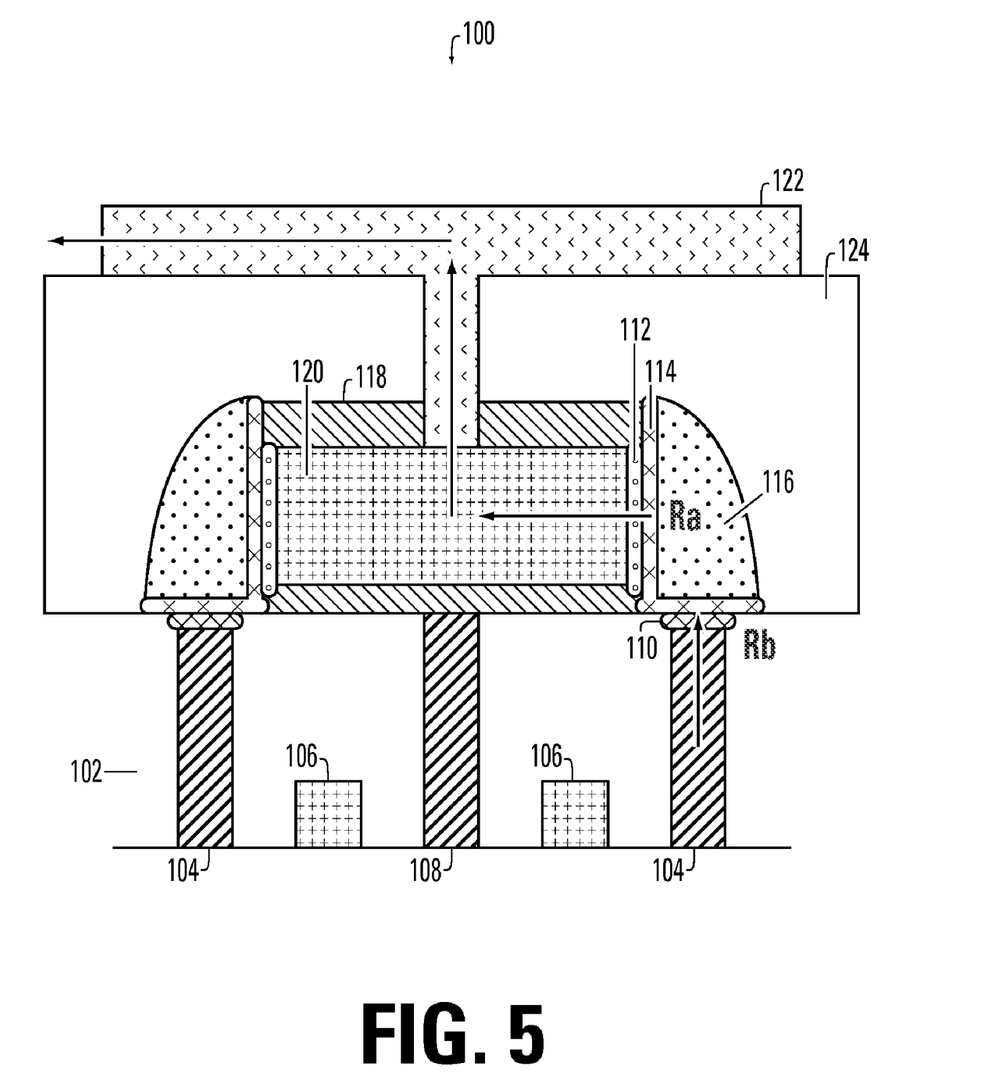
FIG. 5 depicts current flow in the device shown in FIG. 1.

The resulting current flow in the memory cell 100 is shown in FIG. 5, limited to one of the elements for the sake of clarity. As shown by the red arrows, current flows from the underlying circuitry to the memory element through plug element 104. Current then passes through memory layer 110, through the barrier conductive layer 114, and through the second memory layer 112. The amount of current flow is regulated, of course, by the resistance condition of each of the memory layers, as explained above. Current then passes into the metal layer 120 and outward through bit line 122 to the memory circuitry.

Figure 6A:
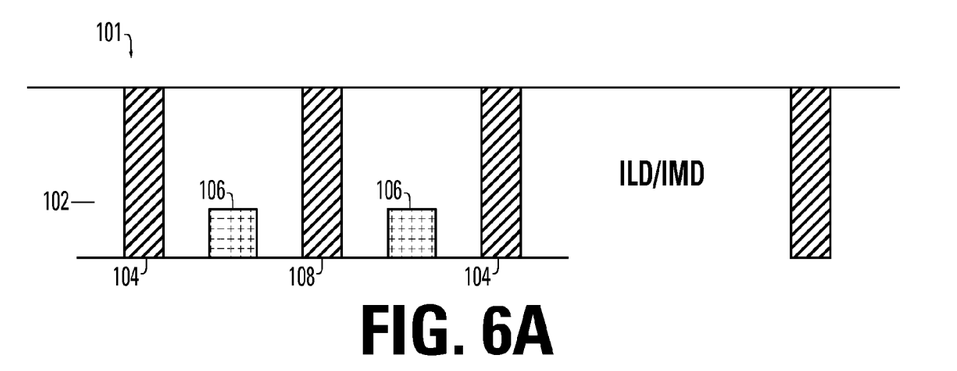
FIGS. 6a-6h illustrate an embodiment of a process for fabricating the memory element shown in FIG. 1.

An embodiment of a process for fabricating a memory cell based on the principles set out above is shown in FIGS. 6a-6h. The underlying structure 101, shown in FIG. 6a, is formed in an entirely conventional manner. The specific components are discussed above. To improve the clarity of the following description, no further identification numerals for components of the underlying structure will be shown.

Figure 6B:
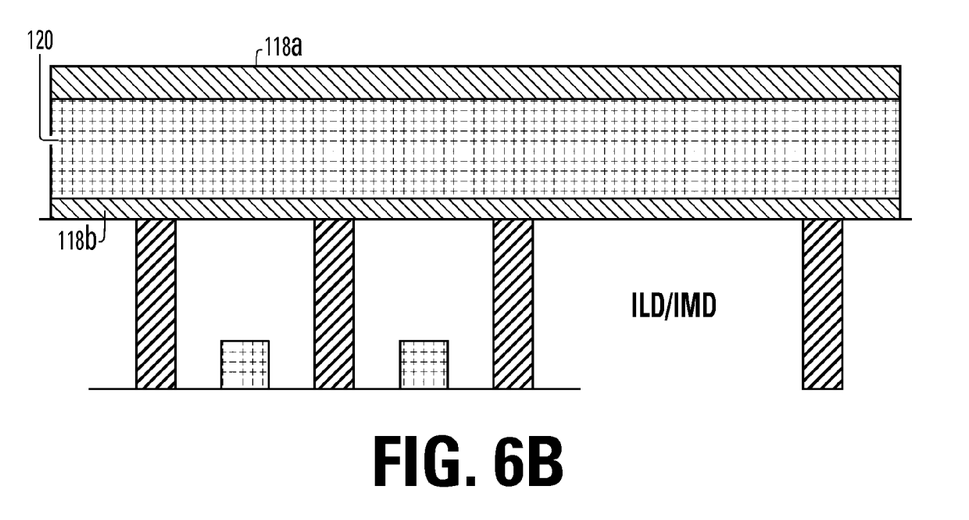
Figure 6C:
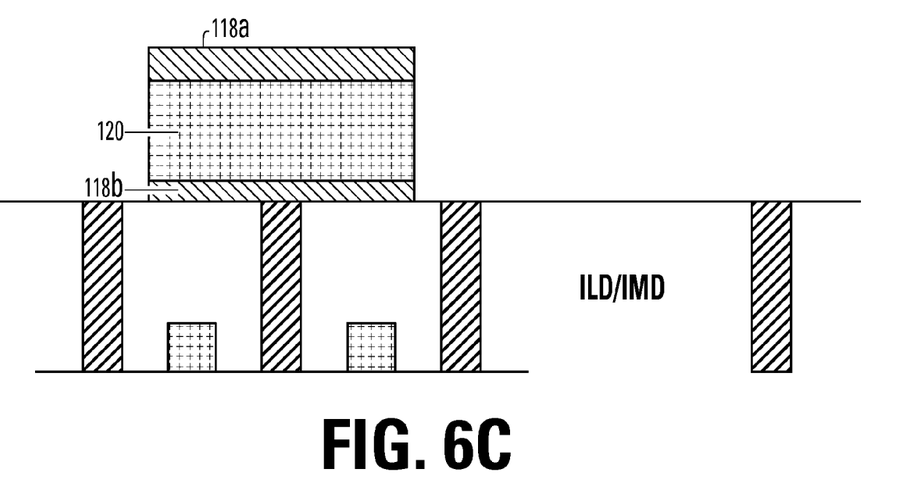

FIG. 6b depicts the deposition of two barrier/insulation layers 118a and 118b, with a metal layer 120 between them. It is preferred to employ conventional CVD tool deposition techniques for this process. That structure is patterned and trimmed, as known in the art, to produce the structure shown in FIG. 6c. As noted above, it is preferred that the resulting trimmed structure should extend to locations just short of the plug elements 104.

Figure 6D:
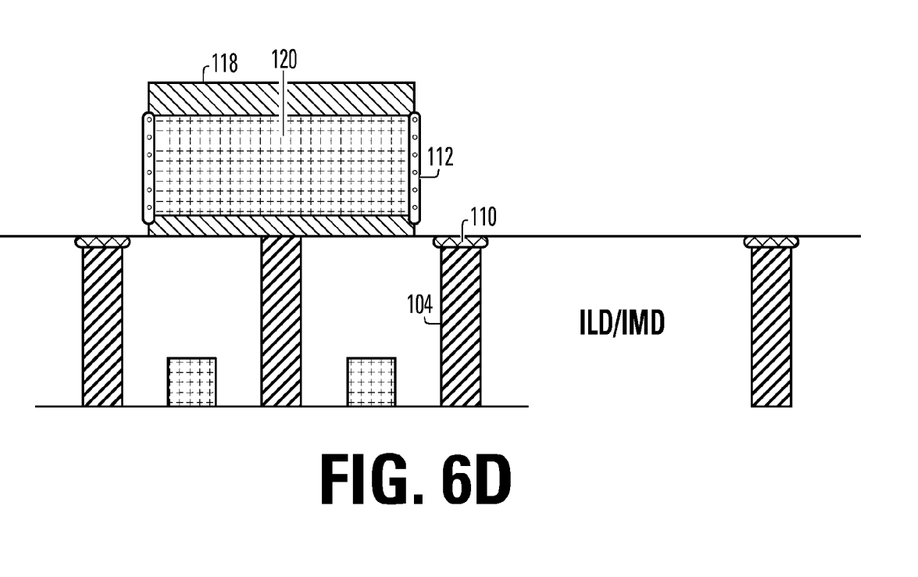

FIG. 6d illustrates the formation of the RRAM elements 112 and 110. Each of these elements is formed by oxidizing the material of the metal layer 120 and the plug element 104, respectively. Preferably, a plasma oxidation process is used, employing mixed chemistries of $O_2$ and $N_2$ in variable ratios. Those in art will understand that the process can be direct or indirect, the latter being implemented by generating downstream plasma in a microwave generator and injecting the same into a reaction chamber with a waveguide. In either event, the required power is in the range 800 to 3000 watts and the chamber pressure should lie in the range 10-500 torr for a directed process and 1000-3000 mtorr in the indirect mode. As noted above, the $O_2$ to $N_2$ ratio can vary from 1:1 to 100% $O_2$, with a 9:1 ratio being preferred. Chamber temperature can range from room temperature to 250 C, with 200 C preferred. Process time is determined by the desired thickness of oxidized metal, with about 400 sec being preferred.

Figure 6E:
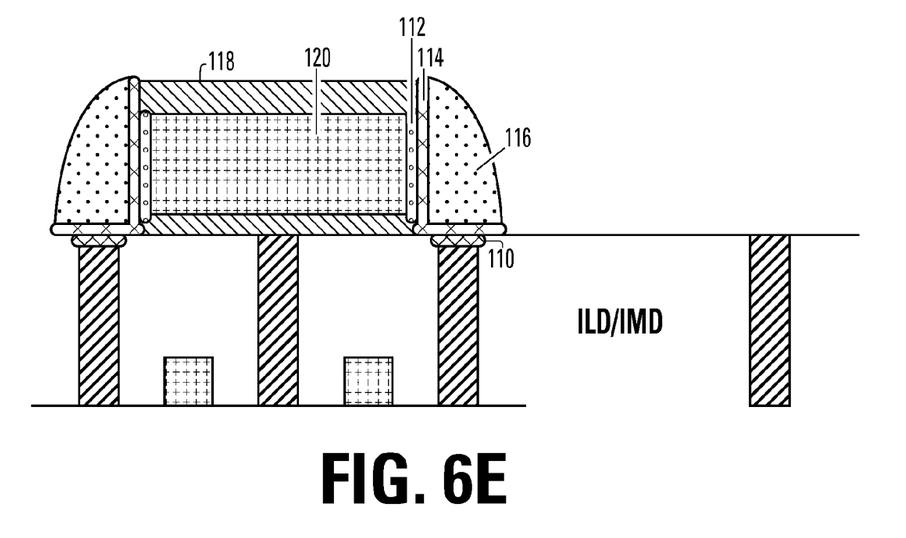

This process results in the formation of two RRAM elements, arranged in an L-shaped pattern, as seen in FIG. 6e. It will be understood that the real size of these components is determined by the size of the metal layer 120 and plug element 104, inasmuch as the components are oxidized in place. The thickness of the components is determined by the oxidation or other formation process, as will be understood in the art.

Electrical contact between the RRAM elements is provided by conductive layer 114, extending in an L-shape to cover the first RRAM element 110 and then in a second direction (preferably about 90 degrees from the first direction) to cover the second RRAM element 112. Conductive layer 114 can be formed from any of the known materials conventionally employed in the art for such applications. In one embodiment, the conductive layers are formed from a Ti compound, such as TiN, or an n+ polysilicon, or a multilayer material that includes a Ti layer, such as a TiN/W/TiN sandwich material, or the similarly structured TiN/Ti/Al/Tin material.

Deposition of an L-shaped layer such as the conductive layer 114 can be accomplished in any of a number of methods known to the art. In one embodiment, a conformal layer of conductive material is deposited over the entirety of the barrier layer/metal layer 118/120 structure. Then, a layer of oxide material 116 is deposited over the barrier material. Photoresist material is applied to the oxide material 116 in the area overlying the L-shaped layer 114, and then both the oxide material and barrier material are removed in a two-step etch process. Both steps employ reactive-ion etching (RIE) to perform anisotropic dry etching. The oxide etch step preferably employs F-based chemistries, such as $CF_4$, $C_4F_8$ and the like. For TiN barrier material a Cl-based etch is preferred, such as $Cl_2$, $BCl_3$ and others known to those in the art. The sharp differences in materials in the various layers makes an end-point detection control method preferable, though time control can be chosen if the specific material etch rates are well established. It should be noted that the oxide and TiN are preferably over-etched to preclude any paths of electrical leakage from TiN residue. Similarly, care should be taken to preserve the shape of the layer 114, as by increasing anisotropy, by, for example, decreasing the chamber pressure, increasing the bias plasma power or by tuning the ratio of etching to polymer passivation.

Figure 6F:
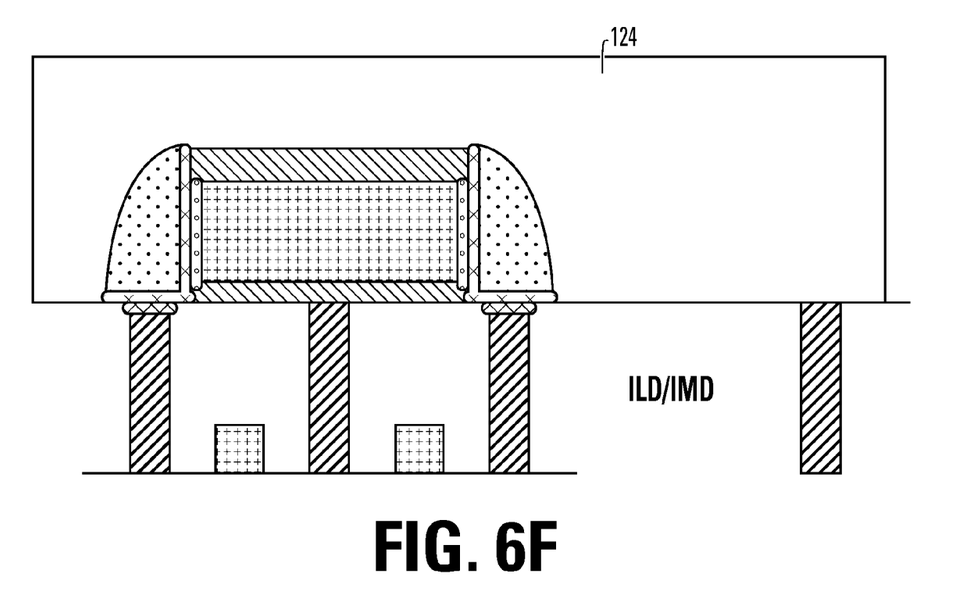

In FIG. 6f the memory cell is encased in a dielectric fill material 124. This material can be the same as that selected for the ILD/IMD 102, or some equivalent known in the art. The dielectric fill material preferably comprises silicon dioxide, a polyimide, silicon nitride or other dielectric fill materials. In embodiments, the fill layer comprises a relatively good insulator for heat as well as for electricity, providing thermal and electrical isolation for the bridges.

Figure 6G:
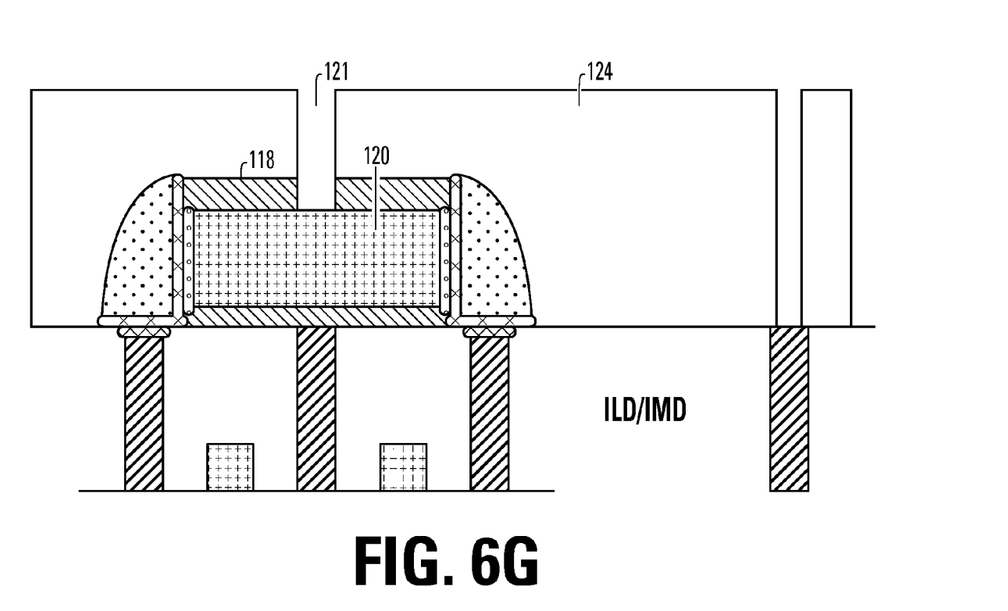
Figure 6H:
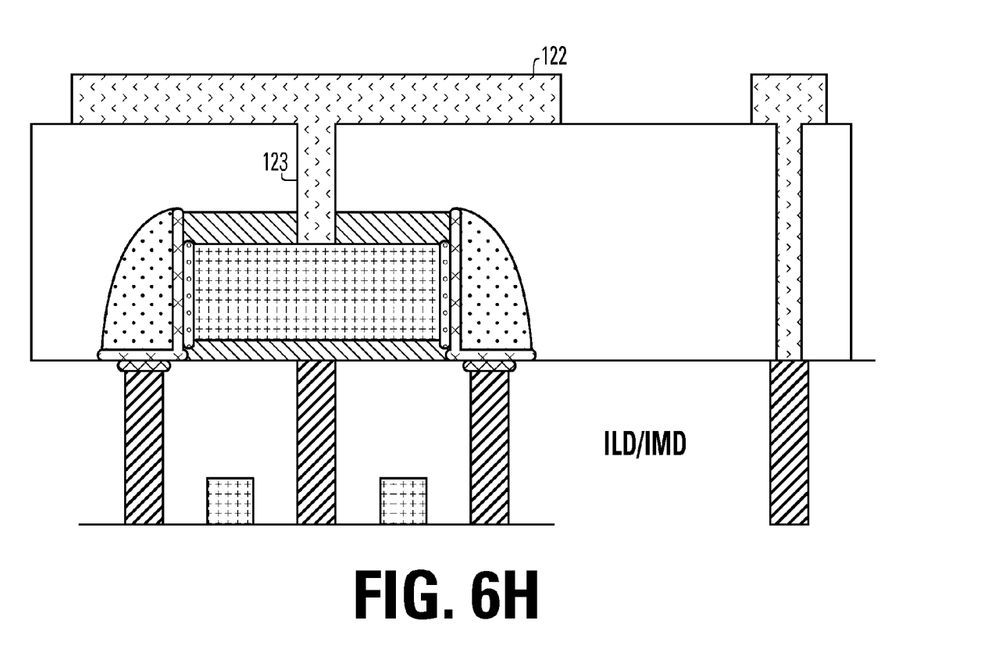

FIGS. 6g and 6h depict the formation of connection elements that permit electrical connections to circuit portions beyond the memory cell. First, as seen in FIG. 6g, a via channel 121 is formed in the dielectric material 124, extending from the top surface of the dielectric, through the barrier/insulator layer 118 and into contact with metal layer 120.

It will be appreciated that a number of changes can be made to the embodiment described above, all within the scope of the invention. For example, the materials of the unit can be altered among those suggested, which in turn will affect the operating characteristics and voltage levels of the device. These and other changes can be made within the scope of the invention, which is defined solely by the claims appended hereto.

We claim:

1. A memory device, comprising:
   a first memory member on a first conductor;
   a second memory member on a second conductor; and
   a third conductor in contact with the first and second memory members, wherein the first and second memory members lay at right angles to one another.

2. The memory device of claim 1, wherein:
   the first memory member is on a top surface of the first conductor; and
   the second memory member is on a sidewall of the second conductor.

3. The memory device of claim 1, wherein:
   the first conductor contacts the first memory member at a first contact surface; and
   the second conductor contacts the second memory member at a second contact surface, the second contact surface orthogonal to the first contact surface.

4. The memory device of claim 3, wherein the first contact surface has a contact area less than a contact area of the second contact surface.

5. The memory device of claim 1, wherein:
   the first memory member has a dimension defined by a dimension of the first conductor; and
   the second memory member has a dimension defined by a dimension of the second conductor.

6. The memory device of claim 5, wherein:
   the first memory member has a width defined by a width of the first conductor; and
   the second memory member has a height defined by a height of the second conductor.

7. The memory device of claim 1, wherein the first and second memory members and the third conductor form a first memory element, and further comprising:
   a second memory element comprising:
       a third memory member on a fourth conductor;
       a fourth memory member on the second conductor, so that the second conductor is shared between the first and second memory elements; and a fifth conductor in contact with the third and fourth memory members, wherein the third and fourth memory members lay at right angles to one another.

8. The memory device of claim 7, wherein:
the second memory member is on a first sidewall of the second conductor; and
the fourth memory member is on a second sidewall of the second conductor.

9. The memory device of claim 7, wherein:
the first and third memory members are in a plane; and
the second and fourth memory members are orthogonal to the plane.

10. The memory device of claim 1, wherein:
the first memory member is self-aligned with the first conductor; and
the second memory member is self aligned with the second conductor.

11. The memory device of claim 1, wherein:
the first memory member comprises an oxide of a material of the first conductor; and
the second memory member comprises an oxide of a material of the second conductor.

12. The memory device of claim 11, wherein:
the first memory member is formed by oxidizing the first conductor; and
the second memory member is formed by oxidizing the second conductor.

13. The memory device of claim 1, wherein the first and second memory members are each programmable to respective high and low resistance states to store a value in the memory device, where said value includes:
a first value corresponding to the low resistance state of the first memory member and the low resistance state of the second memory member;
a second value corresponding to the low resistance state of the first memory member and the high resistance state of the second memory member;
a third value corresponding to the high resistance state of the first memory member and the low resistance state of the second memory member; and
a fourth value corresponding to the high resistance state of the first memory member and the high resistance state of the second memory member.

14. A memory device, comprising:
a first resist member formed on a plug element;
a second resist member formed on a sidewall of a metal layer; and
a conductor in electrical contact between the first resist member and the second resist member, wherein the first and second resist members are arranged in an L-shaped pattern.

* * * * *